United States Patent
Liu et al.

(10) Patent No.: US 10,289,313 B2
(45) Date of Patent: May 14, 2019

(54) METHOD AND APPARATUS FOR IMPROVING SEQUENTIAL READING IN NAND FLASH

(71) Applicant: Intel Corporation, Santa Clara, CA (US)

(72) Inventors: Han Liu, San Jose, CA (US); Shantanu R. Rajwade, Sunnyvale, CA (US); Pranav Kalavade, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 97 days.

(21) Appl. No.: 15/195,452

(22) Filed: Jun. 28, 2016

(65) Prior Publication Data

US 2017/0371565 A1    Dec. 28, 2017

(51) Int. Cl.
| | | |
|---|---|---|
| *G06F 1/24* | (2006.01) | |
| *G06F 3/06* | (2006.01) | |
| *G11C 11/56* | (2006.01) | |
| *G11C 7/06* | (2006.01) | |
| *G11C 16/04* | (2006.01) | |
| *G11C 16/08* | (2006.01) | |
| *G11C 16/32* | (2006.01) | |

(52) U.S. Cl.
CPC ............ *G06F 3/0613* (2013.01); *G06F 3/064* (2013.01); *G06F 3/0659* (2013.01); *G06F 3/0679* (2013.01); *G11C 7/06* (2013.01); *G11C 11/5642* (2013.01); *G11C 16/0483* (2013.01); *G11C 16/08* (2013.01); *G11C 16/32* (2013.01)

(58) Field of Classification Search
CPC .. G06F 12/0246; G06F 12/0811; G06F 13/28; G06F 2212/7208; G06F 2212/2022; G06F 12/0238; G06F 3/064; G11C 11/4074; G11C 29/021; G11C 5/147; G11C 8/08; G11C 7/06; G11C 13/004; G11C 16/26; G11C 11/5628; G11C 11/5642
See application file for complete search history.

(56) References Cited

U.S. PATENT DOCUMENTS

| | | | | |
|---|---|---|---|---|
| 2006/0146612 | A1* | 7/2006 | Lim ................... | G11C 16/26 365/185.21 |
| 2007/0285980 | A1* | 12/2007 | Shimizu ............ | G11C 11/5628 365/185.03 |
| 2015/0127883 | A1* | 5/2015 | Chen .................. | G11C 11/5642 711/103 |
| 2015/0154069 | A1* | 6/2015 | Tuers ................. | G06F 11/1068 714/773 |
| 2016/0049192 | A1* | 2/2016 | Lee ................... | G11C 16/3427 365/185.03 |

(Continued)

*Primary Examiner* — David Yi
*Assistant Examiner* — Candice A Rankin
(74) *Attorney, Agent, or Firm* — Alliance IP, LLC

(57) ABSTRACT

In one embodiment, an apparatus comprises a storage device comprising a NAND flash memory. The storage device is to receive a read request from a computing host; identify a plurality of pages specified by the read request that are stored in the same group of memory cells of the NAND flash memory, wherein each memory cell of the group of memory cells is to store a bit of each of the plurality of identified pages; and read, in a single read cycle, the plurality of pages from the group of memory cells of the NAND flash memory.

21 Claims, 7 Drawing Sheets

(56) References Cited

U.S. PATENT DOCUMENTS

2016/0125951 A1* 5/2016 Sun ................... G11C 11/5642
                                                    365/185.24
2017/0047114 A1* 2/2017 Song .................. G11C 11/5642
2017/0060482 A1* 3/2017 Hara .................... G11C 16/10

* cited by examiner

METHOD AND APPARATUS FOR IMPROVING SEQUENTIAL READING IN NAND FLASH

FIELD

The present disclosure relates in general to the field of computer development, and more specifically, to NAND flash memory.

BACKGROUND

A computer system may include one or more central processing units (CPUs) coupled to one or more storage devices. A CPU may include a processor to execute an operating system and other software applications that utilize the storage devices coupled to the CPU. The software applications may write data to the storage devices. The data may be stored by the storage devices in a plurality of memory cells (e.g., NAND flash memory cells) of the storage devices.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Figure 1:
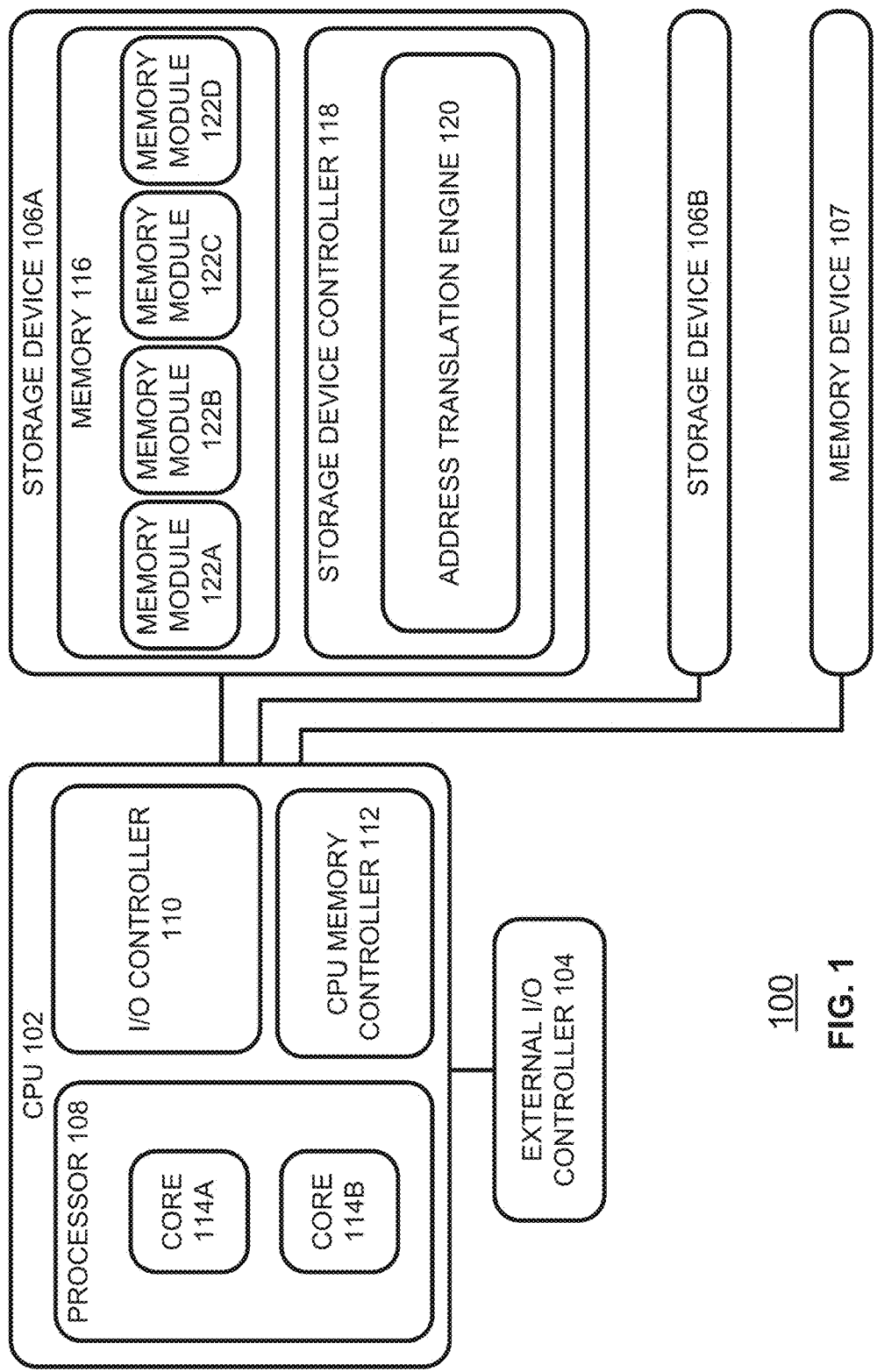
FIG. 1 illustrates a block diagram of components of a computer system in accordance with certain embodiments.

FIG. 1 illustrates a block diagram of components of a computer system 100 in accordance with certain embodiments. System 100 includes a central processing unit (CPU) 102 coupled to an external input/output (I/O) controller 104, a plurality of storage devices 106, and memory device 107. During operation, data may be transferred between storage devices 106 or memory device 107 and the CPU 102. In various embodiments, particular data operations involving a storage device 106 or memory device 107 may be managed by an operating system or other software application executed by processor 108.

In various embodiments, a storage device 106 comprises NAND flash memory. In some embodiments, storage device 106 may be a solid state drive; a memory card; a Universal Serial Bus (USB) flash drive; or memory integrated within a device such as a smartphone, camera, media player, or other computing device. In general, storage devices with NAND flash memory are classified by the number of bits stored by each cell of the memory. For example, a single-level cell (SLC) memory has cells that each store one bit of data, a multi-level cell (MLC) memory has cells that each store two bits of data, a tri-level cell (TLC) memory has cells that each store three bits of data, and a quad-level cell (QLC) memory has cells that each store four bits of data.

A multi-level NAND flash memory (e.g., memory configured as one or more of MLC, TLC, or QLC memory) may program particular pages together into a common group of memory cells for better program performance, often resulting in sequential data being stored in the group of memory cells. In various storage devices, multiple pages may be programmed together in a first programming pass. For example, when memory is programmed according to an MLC scheme, a lower page and an upper page may be programmed simultaneously. In such embodiments, a read operation on these pages can be combined into one read cycle when a sequential read is requested by a computing host (e.g., CPU 102). A sequential read may be a request to read a sequential block of data from adjacent memory locations (e.g., as would be done when reading a large file such as a video, a music file, or an image). The sensing phase of the combined read cycle may involve sensing data at multiple read levels from different pages. When a combined read cycle is used, the overhead due to the other phases of the read cycle (e.g., epilogue, wordline ramp, and read recovery phases) is reduced resulting in various technical advantages, such as faster reads and reduced power consumption as compared to individual read cycles being performed to read each page of data.

CPU 102 comprises a processor 108, such as a microprocessor, an embedded processor, a digital signal processor (DSP), a network processor, a handheld processor, an application processor, a co-processor, a system on a chip (SOC), or other device to execute code (i.e., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more memory devices 107. CPU memory controller 112 may include logic operable to read from a memory device 107, write to a memory device 107, or to request other operations from a memory device 107. In various embodiments, CPU memory controller 112 may receive write requests from cores 114 and/or I/O controller 110 and may provide data specified in these requests to a memory device 107 for storage therein. CPU memory controller 112 may also read data from a memory device 107 and provide the read data to I/O controller 110 or a core 114. During operation, CPU memory controller 112 may issue commands including one or more addresses of the memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A memory device 107 may store any suitable data, such as data used by processors 106 to provide the functionality of computer system 100. For example, data associated with programs that are executed or files accessed by cores 110 may be stored in memory device 107. Thus, a memory device 107 may include a system memory that stores data and/or sequences of instructions that are used or executed by the cores 114. In various embodiments, a memory device 107 may store persistent data (e.g., a user's files or instruction sequences) that remains stored even after power to the memory device 107 is removed. A memory device 107 may be dedicated to a particular CPU 102 or shared with other devices (e.g., one or more other processors or other device) of computer system 100.

In various embodiments, a memory device 107 may include a memory comprising any number of memory modules, a memory device controller, and other supporting logic (not shown). A memory module may include non-volatile memory and/or volatile memory. Non-volatile memory is a storage medium that does not require power to maintain the state of data stored by the medium. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106 may store any suitable data, such as data used by processor 108 to provide functionality of computer system 100. For example, data associated with programs that are executed or files accessed by cores 114 may be stored in storage device 106. Thus, a storage device 106 may include a system memory that stores data and/or sequences of instructions that are used or executed by the cores 114. In various embodiments, a storage device 106 may store persistent data (e.g., a user's files or software application code) that remains stored even after power to the storage device 106 is removed. A storage device 106 may be dedicated to CPU 102 or shared with other devices (e.g., another CPU or other device) of computer system 100.

In the embodiment depicted, storage device 106A includes a storage device controller 118 and a memory 116 comprising a plurality of memory modules 122A-D, however, a storage device may include any suitable number of memory modules 122. A memory module 122 includes a plurality of memory cells that are each operable to store one or more bits. The cells of a memory module 122 may be arranged in any suitable fashion, such as in rows (e.g., wordlines) and columns (e.g., bitlines), three dimensional structures, or other manner. In various embodiments, the cells may be logically grouped into banks, blocks, sub-blocks, wordlines, pages, frames, bytes, or other suitable groups. In various embodiments, a memory module 122 comprises one or more NAND flash memory arrays.

Figure 2:
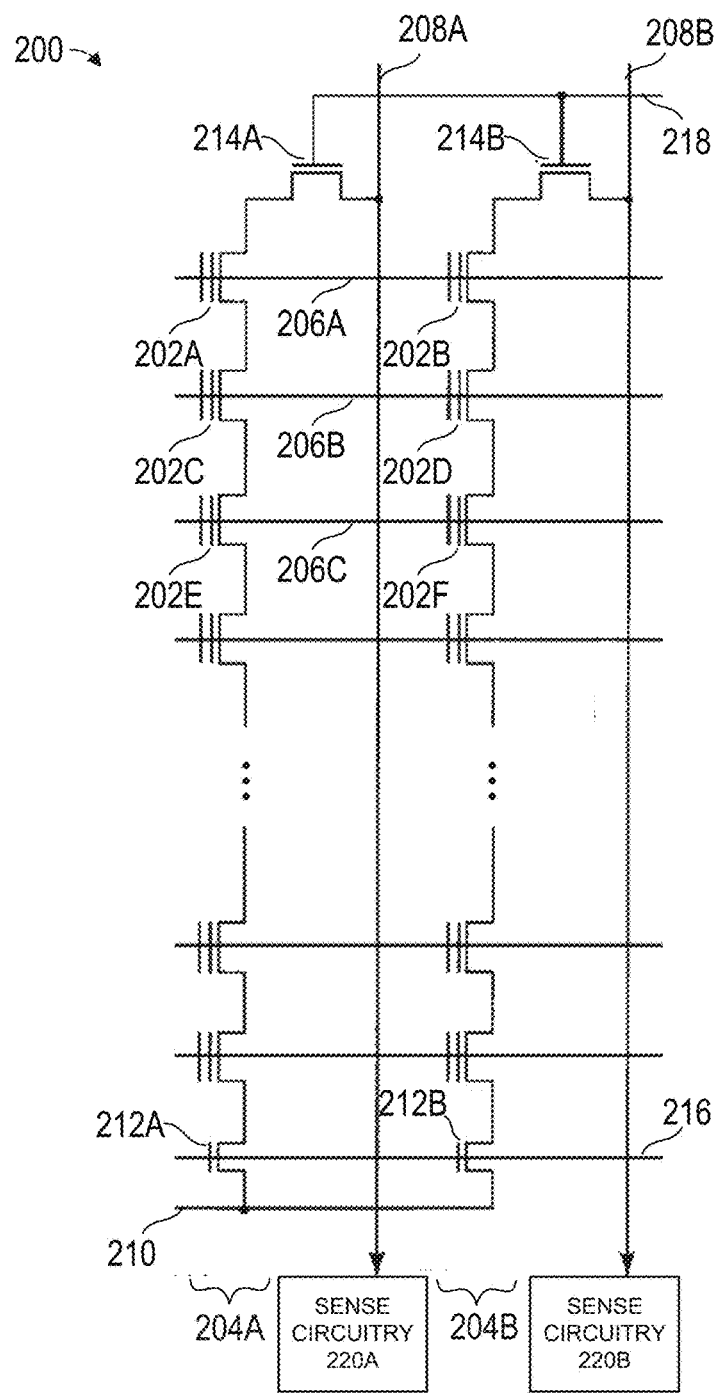
FIG. 2 illustrates an example diagram of a portion of a NAND flash memory array in accordance with certain embodiments.

FIG. 2 illustrates an example diagram of a portion of a NAND flash memory array 200 in accordance with certain embodiments. NAND flash memory array 200 may comprise a plurality of non-volatile memory cells 202 arranged in columns such as series strings 204. In various embodiments, a memory cell 202 may comprise a transistor with a floating gate that stores charge indicative of one or more bit values stored by the memory cell 202. In the series strings 204, the drains of the cells 202 are each (with the exception of the top cell) coupled to a source of another cell 202.

The array 200 also includes wordlines 206. A wordline 206 may span across multiple series strings 204 (e.g., being coupled to one memory cell of each series string 204) and are connected to the control gates of each memory cell 202 of a row of the array 200 and used to bias the control gates of the memory cells 202 in the row. The bitlines 208 are each coupled to a series string 204 by a drain select gate 214 and sensing circuitry 220 that detects the state of each cell by sensing voltage or current on a particular bitline 208.

Each series string 204 of memory cells is coupled to a source line 210 by a source select gate 212 and to an individual bit line 208 by a drain select gate 214. The source select gates 212 are controlled by a source select gate control line 216 and the drain select gates 214 are controlled by a drain select gate control line 218.

Figure 3:
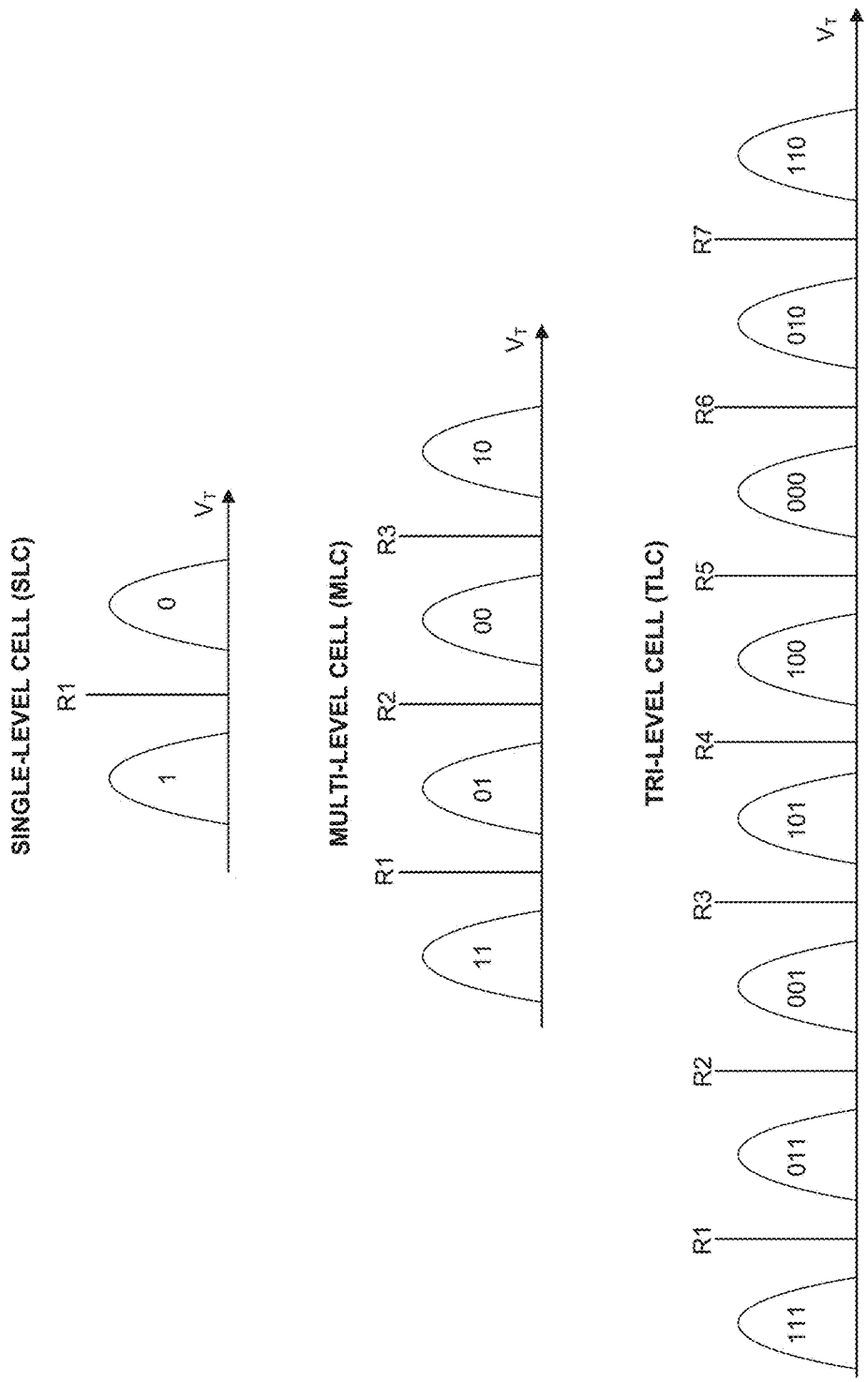
FIG. 3 illustrates example encoding schemes for NAND flash memory cells in accordance with certain embodiments.

In various embodiments, each memory cell 202 can be programmed by an SLC, MLC, TLC, a QLC, or other encoding scheme. Each cell's threshold voltage (Vt) is indicative of the data that is stored in the cell. FIG. 3 illustrates example encodings of bits within NAND flash memory cells 202 in accordance with certain embodiments. In the embodiment depicted, each elliptical region represents a range of threshold voltages that correspond to the value encoded within the cell. For example, in the SLC encoding scheme, lower threshold voltages correspond to the bit value 1 and higher threshold voltages correspond to the bit value 0. As another example, in the MLC encoding scheme, the lowest range of threshold voltages corresponds to "11", the next highest range of threshold voltages corresponds to "01", the next highest range of threshold voltages corresponds to "00", and the highest range of threshold voltages correspond to "10." Similarly, for the TLC encoding scheme (or other encoding schemes not shown), various ranges of threshold voltages correspond to various values of the bits encoded within each cell.

The various R voltage values depicted in FIG. 3 (e.g., R1, R2, R3, . . . ) represent read voltages that may be applied to a wordline when the values of the cells are being read. When a particular read voltage is replied, sense circuitry 220 may determine whether the threshold value of a cell is greater than or less than the read voltage based on a voltage or current sensed by the sense circuitry 220. Although not shown in FIG. 3, a QLC encoding scheme may utilize a similar scheme where fifteen read voltages may be used to resolve the values of four bits within each cell, where R1<R2<R3 . . . <R15. Reference to such read voltages is made below in connection with FIGS. 5 and 6.

Referring again to FIG. 1, a memory module 122 may include non-volatile memory, such as planar or 3D NAND flash memory. Non-volatile memory is a storage medium that does not require power to maintain the state of data stored by the medium. In particular embodiments, a memory module 122 with non-volatile memory may comply with one or more standards for non-volatile memory promulgated by the Joint Electron Device Engineering Council (JEDEC), such as JESD218, JESD219, JESD220-1, JESD220C, JESD223C, JESD223-1, or other suitable standard (the JEDEC standards cited herein are available at www.jedec.org). In particular embodiments, the storage device comprises NAND flash memory that complies with one or more portions of a standard promulgated by JEDEC for SDRAM memory, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage devices 106 that implement such standards may be referred to as DDR-based interfaces. For example, a storage device 106 comprising NAND flash memory may receive a command that has a format compliant with a DDR-based standard and may translate the command into one or more commands that are compatible with NAND flash memory of the storage device 106. Similarly, the storage device 106 may format results from operations performed on the NAND flash memory into a format that is compliant with a DDR-based standard before transmitting the results to the CPU 102.

Storage devices 106 may comprise any suitable type of memory and are not limited to a particular speed, technology, or form factor of memory in various embodiments. For example, a storage device 106 could be a disk drive (such as a solid state drive), a flash drive, memory integrated with a computing device (e.g., memory integrated on a circuit board of the computing device), a memory module (e.g., a dual in-line memory module) that may be inserted in a memory socket, or other type of storage device. Moreover, computer system 100 may include multiple different types of storage devices 106. Storage devices 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. Storage devices 106 may also include a communication interface to communicate with CPU memory controller 112 or I/O controller 110 in accordance with any suitable logical device interface specification such as NVMe, AHCI, or other suitable specification. In particular embodiments, storage device 106 may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to memory 116, and provide data associated with the requests to CPU 102 (e.g., via CPU memory controller 112 or I/O controller 110). Controller 118 may also be operable to detect and/or correct errors encountered during memory operation. In an embodiment, controller 118 also tracks the number of times particular cells (or logical groupings of cells) have been written to in order to perform wear leveling and/or to detect when cells are nearing an estimated number of times they may be reliably written to. In performing wear leveling, the storage device controller 118 may evenly spread out write operations among blocks of the memory 116 such that particular blocks are not written to more than other blocks. In various embodiments, controller 118 may also monitor various characteristics of the storage device 106 such as the temperature or voltage and report associated statistics to the CPU 102. Storage device controller 118 can be implemented on the same chip, board, or device as memory 116 or on a different chip, board, or device. For example, in some environments, storage device controller 118 may be a centralized storage controller that manages memory operations for multiple different memories 116 (which could each be of the same type or could be of different types) of computer system 100 (and thus could provide storage device controller functionality described herein to any of the memories to which it is coupled).

In various embodiments, the storage device 106 also includes an address translation engine 120. In the depicted embodiment, the address translation engine 120 is shown as part of the storage device controller 118, although in various embodiments, the address translation engine 120 may be separate from the storage device controller 118 and communicably coupled to the storage device controller 118. In various embodiments, the address translation engine 120 may be integrated on the same chip as the storage device controller 118 or on a different chip.

In various embodiments, address translation engine 120 may include logic to store and update a mapping between a logical address space (e.g., an address space visible to a computing host coupled to the storage device 106) and the physical address space of the memory 116 (which may or may not be exposed to the computing host). The logical address space may expose a plurality of logical groups of data which is physically stored on corresponding physical groups of memory addressable through the physical address space of the storage device 106. A physical address of the physical address space may comprise any suitable information identifying a physical memory location (e.g., a location within memory 116) of the storage device 106, such as an identifier of the memory module 122 on which the physical memory location is located, one or more pages of the physical memory location, one or more subblocks of the physical memory location, one or more wordlines of the physical memory location, one or more bitlines of the physical memory location, or other suitable identifiers or encodings thereof.

In particular embodiments, storage device controller 118 (e.g., via address translation engine 120 or other logic) may store a programming order for portions of the memory 116. For example, the programming order may specify an order in which pages and/or wordlines of the memory 116 are to be programmed. In various embodiments, storage device controller 118 may also store information indicative of which pages programmed into the same group of cells (when the cells are encoded with multiple bits) include sequential data (e.g., which pages were programmed together using a single programming pass).

The address translation engine 120 or other portion of storage device 106 may include any suitable memory type for storing logical to physical mapping structures, programming orders, and other information and any suitable logic for changing values stored in the logical to physical mapping structures, programming orders, and other information (e.g., in response to a request from the storage device controller 118) and reading values from the logical to physical mapping structures, programming orders, and other information (e.g., to provide the values to the storage device controller 118 for use in memory operations).

Storage media for the logical to physical mapping structures, programming orders, and other information may be included within the address translation engine 120 and/or storage device controller 118 or may be communicably coupled to the address translation engine and/or storage device controller. In various embodiments, storage media for the logical to physical mapping structures, programming orders, and other information may be integrated on the same chip as the storage device controller 118 and/or address translation engine 120 or may be implemented on a separate chip.

In various embodiments, the address translation engine 120 and/or storage device controller 118 may provide wear leveling through management of the address mappings of the logical to physical mapping structures, programming orders, and other information. In particular embodiments, the address translation engine 120 and/or storage device controller 118 may also prevent the use of bad memory cells (or logical grouping of cells) by not allowing physical addresses for the bad cells (or logical grouping of cells) to be mapped to the logical address space.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die or package (i.e., on-chip) or any of the elements of CPU 102 may be located off-chip. Similarly, the elements depicted in storage device 106A may be located on a single chip or on multiple chips. In various embodiments a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

In various embodiments, NAND flash memory cells are programmed via one or more programming "passes." A programming pass may include several program loops (e.g., between three and thirty program loops depending on the number of bits to be encoded by the cell). A program loop includes selecting a wordline, applying a program pulse voltage to the cells (e.g., applying the voltage to control gates of the cells of the wordline while coupling the channels of the cells to ground to allow charge to flow into the floating gates of the cells), and then applying several verify pulses to determine whether the cells have each reached the appropriate threshold voltage. In each subsequent program loop, the program pulse voltage is stepped higher to allow cells that are to be programmed with higher threshold voltages to reach the appropriate level. During a program loop, if a cell is determined to have reached the appropriate level, that cell is inhibited (e.g., by floating the channel of the cell) during subsequent program loops.

In particular embodiments, cells may be programmed a page at a time, where a page is stored in a group of cells that are coupled to the same wordline. For example, the group of cells may be identified by a particular wordline and a particular subblock. As another example, the group of cells may represent all of the cells of the wordline. The group of cells may store one page of data (if the cells are encoded according to an SLC scheme) or multiple pages of data (if the cells are encoded according to an MLC, TLC, QLC, or other multi-level encoding scheme).

Referring again to FIG. 3, a cell that is encoded to store multiple bits may form a part of multiple different pages, with each bit of the cell corresponding to a distinct page. For example, for a cell that is encoded with two bits (i.e., using a MLC encoding scheme), one bit may correspond to an upper page (UP) and the other bit may correspond to a lower page (LP). As another example, for a cell that is encoded with three bits (i.e., using a TLC encoding scheme), one bit may correspond to an LP, one bit may correspond to a UP, and the other bit may correspond to an extra page (XP). As yet another example, for a cell that is encoded with four bits (i.e., using a QLC encoding scheme), one bit may correspond to an LP, another bit may correspond to a UP, another bit may correspond to an XP, and the final bit may correspond to a top page (TP). Each page (e.g., LP, UP, XP, or TP) may comprise an aggregation of corresponding bits from a plurality of different cells of a wordline. For example, referring to the encoding shown in FIG. 3, all of the rightmost bits of a plurality of cells encoded using a TLC scheme may form an LP, all of the middle bits of the plurality of cells may form a UP, and all of the leftmost bits of the plurality of cells may form an XP.

A single programming pass may encode one or more pages. For example, when the cells of a wordline are encoded using an MLC scheme, both pages (the LP and the UP) may be programmed during a single programming pass by setting the voltage levels of the cells to the desired program level (e.g., within one of the four voltage ranges depicted for the MLC scheme in FIG. 3). Alternatively, an LP could be programmed in a first pass and a UP could be programmed in a second pass. For example, during the first pass, first bits of the cells (where the first bits of the cells collectively form the LP) may be programmed to a binary state based on the desired value of each bit. For example, referring to the MLC scheme depicted in FIG. 3, if the rightmost bits of the cells form the LP, and a particular rightmost bit is to be programmed to a '0' value, the Vt of the cell may be programmed to a value that is greater than R2 (i.e., read level 2) in the first programming pass. If a particular rightmost bit is to be programmed to a '1' value, it may be left at a low voltage level. During the second pass, second bits of the same cells (where the second bits of the cells collectively form the UP) are programmed, resulting in the Vt of the cells being changed to their desired Vt (e.g., within one of the four voltage ranges depicted for the MLC scheme in FIG. 3), thus storing values for the UP and the LP.

As another example, when the cells of a wordline are encoded using a TLC scheme, all pages (the LP, the UP, and the XP) may be programmed during a single programming pass by setting the voltage levels of the cells to the desired program level (e.g., within one of the eight voltage ranges depicted for the TLC scheme in FIG. 3). Alternatively, the programming of the cells may be split into two or three passes. For example, the LP and the UP may be programmed together in a first pass (e.g., such that the cells are programmed to levels that would allow reading of the bits of the LP and the UP if reads of the LP and/or UP were performed as described herein) and the XP may be programmed in a second pass (e.g., such that after the XP is programmed any of the three bits of the various pages may be read using methods described herein). As another example, the LP may be programmed in a first pass and the UP and XP may be programmed in a second pass. As yet another example, the LP may be programmed in a first pass, the UP may be programmed in a second pass, and the XP may be programmed in a third pass.

As yet another example, when the cells of a wordline are encoded using a QLC scheme, all pages (the LP, the UP, the XP, and the TP) may be programmed during a single programming pass by setting the voltage levels of the cells to the desired program level (e.g., within one of sixteen different voltage ranges of the QLC scheme). Alternatively, the programming may be split into two, three, or four passes. For example, the LP, UP, and XP may be programmed in a first pass and the TP may be programmed in a second pass. As another example, the LP and the UP may be programmed together in a first pass and the XP and the TP may be programmed in a second pass. As another example, the LP may be programmed in a first pass and the UP, XP, and TP may be programmed in a second pass. In other embodiments, the programming sequence may take place in any suitable order.

In particular embodiments, if multiple passes are used to program the cells of a first wordline, one or more programming passes may be performed on one or more adjacent wordlines after an initial programming pass is performed on the first wordline and before an additional programming pass is performed on the first wordline. Such embodiments may mitigate the effects of interference caused to cells by the programming of neighboring wordlines. In other embodiments, multiple passes may be performed on the cells of a wordline before the next wordline is programmed.

In particular embodiments, a logical page of data (i.e., a page of data referred to by a computing host such as CPU 102) may correspond to an LP, UP, XP, TP, or other page of memory stored in cells that are encoded with multiple bits. Accordingly, two logical pages of data may correspond to an LP and a UP stored in a group of cells encoded using an MLC scheme, three logical pages of data may correspond to an LP, UP, and XP stored in a group of cells encoded using a TLC scheme, four logical pages of data may correspond to an LP, UP, XP, and TP stored in a group of cells encoded using a QLC scheme, and so on. Thus, when a computing host writes to storage device 106, if multiple pages are to be programmed in a single pass, multiple logical pages from the computing host may be aggregated and programmed in the pass. For example, in memory encoded using a TLC scheme, when the LP and UP are programmed in a single pass, two logical pages of data may be aggregated (where one logical page is stored in the LP and one logical page is stored in the UP).

In particular embodiments, data encoded in multi-level NAND flash cells may comprise sequential data, that is, data that is written to sequential logical pages by a computing host. Sequential logical pages may refer to pages with logical addresses that are sequential. For example, a first logical page having a logical address is sequential with a second logical page that has the next available logical address. Sequential data from a file written by a computing host to storage device 106A may be stored by writing a first page of data to a first logical page have a first logical address, a second page of data to a second logical page having the next available logical address, a third page of data to a third logical page having the next available logical address after the logical address of the second logical page, and so on. In particular embodiments, sequential data may be stored in the same group of cells using multiple pages stored by the cells. For example, using the example above, the first logical page may be stored on a LP stored using a particular bit in each of a group of cells (e.g., of the same wordline), the second logical page on a UP using a different bit in each of the group of cells, and the third logical page on an XP using yet another bit of the group of cells, when the group of cells is encoded using a TLC scheme. Similarly, memory cells encoded using an MLC scheme or a QLC scheme could include sequential data on two or more of the various pages of such memory cells.

In particular embodiments, sequential data is stored together in pages that are programmed using the same programming pass. For example, when MLC encoding is used, data written to a first logical page by a computing host may be programmed into the LP and data written to a second logical page (which is the next logical page in a sequential ordering of the logical pages) may be programmed into the UP in the same programming pass. As another example, a single pass may be used to program sequential data to an LP and UP of memory cells encoded using a TLC scheme. As another example, a single programming pass may be used to program sequential data to an LP, UP, and XP with sequential data of memory encoded using a TLC scheme. As another example, a single programming pass may be used to program sequential data to an LP, UP, and XP of memory encoded using a QLC scheme. As another example, a single programming pass may be used to program sequential data to an LP, UP, XP, and TP of memory encoded using a QLC scheme. Other embodiments may include sequential data being programmed to any combination of pages stored by a common group of cells.

In various embodiments, some pages stored by a group of cells may store sequential data while one or more other pages stored by the group of cells do not store sequential data. For example, in memory encoded using a TLC scheme, the LP and UP may store sequential data while the XP does not store sequential data. For example, in a system where a wordline is partially programmed (e.g. the LPs and UPs of a first wordline are programmed, then the LP and UPs of a second wordline are programmed, then the XPs of the first wordline are programmed) the storage device may receive logical pages 1 and 2 (which comprise sequential data) from a computing host, program these pages in a single programming pass to an LP and a UP of a particular group of cells of a particular wordline, receive one or more additional logical pages which may be programmed to other LPs and UPs of the wordline or a different wordline, and then receive logical page n which is to be programmed to the XP of the same cells that store the sequential data of logical pages 1 and 2. Accordingly, the XP may comprise data that is not sequential with the sequential data stored to the LP and UP. Similarly, particular pages of memory encoded in a single programming pass using a QLC scheme may include sequential data while one or more other pages encoded in a separate programming pass do not include data that is sequential to the corresponding pages that include the sequential data. As will be described below, combining the reading of multiple pages of sequential data into a single read cycle may offer various advantages over reading pages in separate read cycles.

Figure 4:
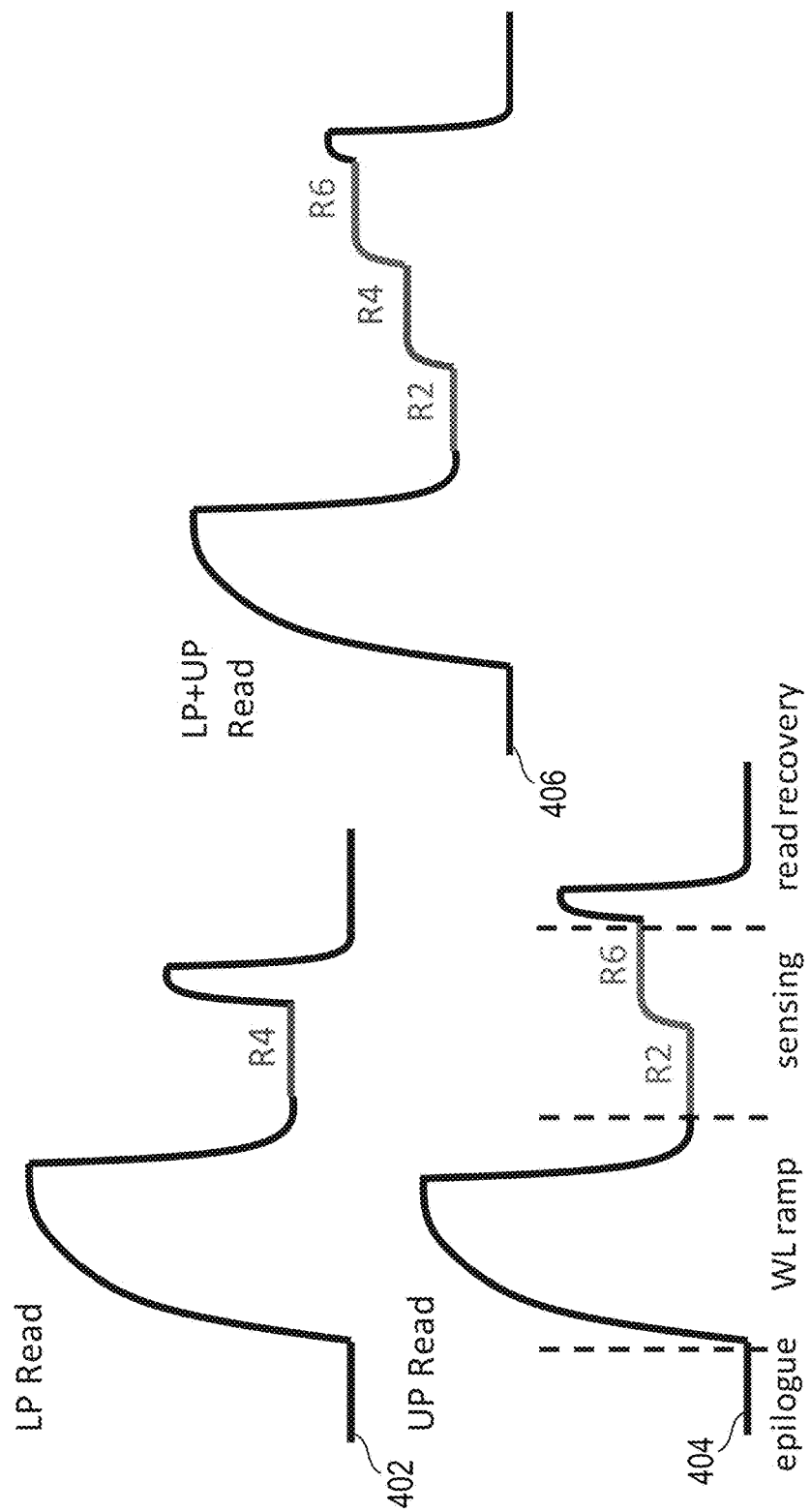
FIG. 4 illustrates example read cycles for tri-level cell (TLC) NAND flash memory cells in accordance with certain embodiments.

FIG. 4 illustrates example read cycles for tri-level cell (TLC) NAND flash memory cells in accordance with certain embodiments. The read cycles depicted show various voltage waveforms applied to the wordline from which data is to be read. Read cycles 402 and 404 depict a read cycle wherein a single page of data is read. In cycle 402 an LP is read and in cycle 404 a UP is read. A read cycle used to read a single page of data may include any suitable phases. In the embodiment depicted, the read cycles each include epilogue, wordline ramp, sensing, and read recovery phases. During the epilogue phase (which may also be known as a prologue phase), the logic is prepared for a read. During this phase, the storage device controller 118 may receive a read command and send one or more signals to a memory module 122 to initiate the read. During the wordline ramp phase, each wordline of a memory array (which includes the data to be read as well as other data) is ramped up to a high level (e.g., higher than the highest programmed Vt).

In the sensing phase, the wordline that is being read is adjusted to one or more read levels while the remaining wordlines are held high. During the sensing phase the bitlines of the array are sensed (e.g., their currents or voltages are read) to determine the value of a particular bit stored in the cells coupled to the bitlines (based on the perceived threshold voltages of the cells). For example, when the bits forming the lower page are read in cycle 402, the wordline voltage is adjusted to R4. Referring again to the TLC scheme depicted in FIG. 3, if the Vt of a cell is higher than R4, the bit of the lower page (i.e., the rightmost bit) is sensed as '0' and if the Vt of the cell is lower than R4, the bit is sensed as '1'. As another example, when the bits forming the upper page are read in cycle 404, the wordline voltage is adjusted to R2 and then R4 during the sensing phase. At each of these read voltages, the bitlines of the array are sensed to determine the value of a particular bit stored in the cells coupled to the bitlines (based on the perceived threshold voltages of the cells). For example, when the bits forming the UP are read in cycle 404, the wordline voltage is adjusted to R2 and to R6, and the bitlines are sensed. If the Vt of a cell is higher than R2 and lower than R6, the bit of the UP (i.e., the middle bit) is sensed as '0' and if the Vt of the cell is lower than R2 or higher than R6, the bit is sensed as '1'. After the sensing phase is complete, the wordline may be ramped up to the level (or near the level) of the other wordlines and then ramped down to a low level during the read recovery phase. An XP read of TLC encoded memory may include a similar cycle, with the read levels set to R1, R3, R5, and R7 during the sensing phase to determine the threshold voltages of the bits of the XP.

Figure 5:
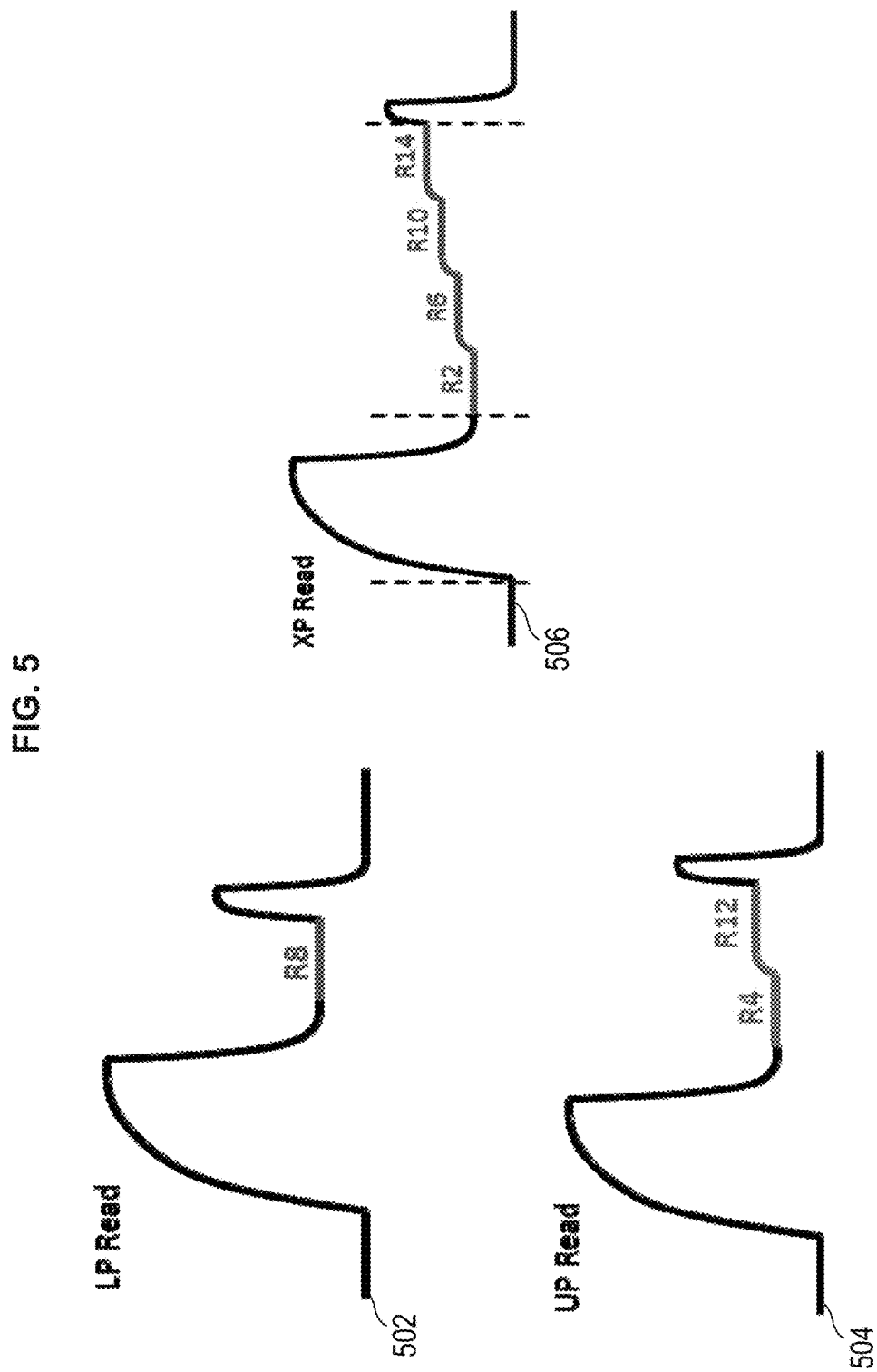
FIG. 5 illustrates example read cycles for quad-level cell (QLC) NAND flash memory cells in accordance with certain embodiments.

FIG. 5 illustrates example read cycles for quad-level cell (QLC) NAND flash memory cells in accordance with certain embodiments. Similar to the cycles 402 and 404 of FIG. 4; cycles 502, 504, and 506 of FIG. 5 depict reading of a single page per read cycle. In each of these cycles, the epilogue, wordline ramp, and read recovery phases are similar to the phases shown in cycles 402 and 404. As depicted in cycle 502, when the LP of a group of cells of a wordline is read, the selected wordline voltage is sensed at a single read voltage R8. As depicted in cycle 504, when the UP of the same group of cells is read, the selected wordline voltage is sensed at read voltages R4 and R12. As depicted in cycle 506, when the XP of the same group of cells is read, the selected wordline is sensed at read voltages R2, R6, R10, and R14. In another example, if the TP were to be read, the selected wordline may be sensed at read voltages R1, R3, R5, R7, R9, R11, R13, and R15.

In various other embodiments, the bit values represented by the voltage regions for each encoding scheme may take any suitable form. In some embodiments, the configuration of the bit values may result in a change in the number of read levels used during the sensing phase for one or more of the pages. For example, in another embodiment, two read levels (instead of one as depicted above) may be used to sense the LP, two read levels may be used to sense the UP, and three read levels may be used to sense the XP. Depending on the embodiment, any suitable number of read levels may be sensed during the read of a particular page.

The read cycles explained so far involve the reading of a single page during a read cycle. In various embodiments of the present disclosure, multiple pages are read during a single read cycle. Referring again to FIG. 4, cycle 406 depicts a read cycle that combines the reading of the LP and the UP of memory encoded using a TLC scheme in a single read cycle. In cycle 406, the epilogue, wordline ramp, and read recovery phases are similar to the phases shown in cycles 402 and 404. However, during the sensing phase, each read level (R2, R4, and R6) that was sensed in cycles 402 and 404 to read the LP and the UP is sensed during a single sensing phase. Based on the results of the sensing performed at these read levels, two bits from each cell forming the pages is resolved (thus the LP and the UP are read during a single read cycle). Because the read of two pages is performed during a single cycle, the power and time overhead is reduced, as the combined read includes a single epilogue, wordline ramp, and read recovery phase instead of two of each of these phases as in the case of two separate read cycles that each read a single page. In another embodiment, the XP could also be read in the same read cycle as the LP and the UP by expanding the read levels sensed during the sensing phase to include R1, R3, R5, and R7, thus saving two epilogue, wordline ramp, and read recovery phases. In yet another embodiment, the UP and the XP may be read together in the same read cycle while the LP is read in an additional read cycle.

Figure 6:
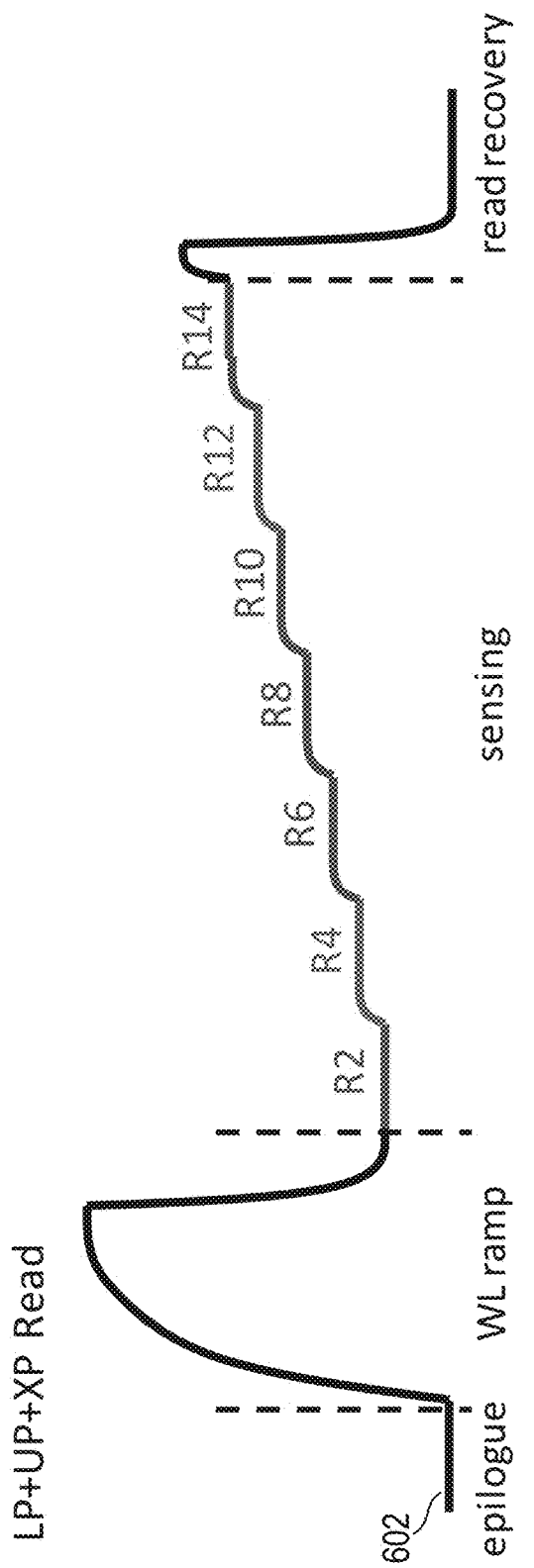
FIG. 6 illustrates another example read cycle for quad-level cell (QLC) NAND flash memory cells in accordance with certain embodiments.

FIG. 6 illustrates another example read cycle 602 for quad-level cell (QLC) NAND flash memory cells in accordance with certain embodiments. Cycle 602 depicts a read cycle that combines the reading of the LP, UP, and XP of memory encoded using a QLC scheme into a single read cycle. In cycle 602, the epilogue, wordline ramp, and read recovery phases are similar to the phases shown in cycles 502, 504, and 506 (where these pages were each read in a distinct read cycle). However, during the sensing phase, each read level (R2, R4, R6, R8, R10, R12, and R14) that was applied in cycles 502, 504, and 506 to read the LP, UP, and XP is applied during a single sensing phase and the cells are sensed at each read level. Based on the results of the sensing performed at these read levels, three bits from each cell forming the pages is resolved. Because the read of three pages is performed during a single cycle, the power and time overhead is reduced, as the combined read includes a single epilogue, wordline ramp, and read recovery phase instead of three of each of these phases as in the case of three separate read cycles that each read a single page. In another embodiment, the TP could also be read in the same read cycle as the LP, UP, and XP by expanding the read levels sensed during the sensing phase to include R1, R3, R5, R7, R9, R11, R13, and R15, thus saving three epilogue, wordline ramp, and read recovery phases. In other embodiments, any combination of the pages may be read together in the same read cycle while the other page(s) are read in one or more other read cycles.

Reading multiple pages in a single cycle is particularly useful when a computing host is requesting the read of sequential data. As describe above, it is typical for pages that are programmed together in a single programming pass to include sequential data. Thus, when pages that are programmed together in a single programming pass are read, these pages may be read together in a single read cycle. In various embodiments, it may also be advantageous to read all available pages (e.g., LP, UP, XP, TP) of a cell together in a single read cycle. For example, if the computing host is accessing a particularly large block of sequential data, even if one or more of these pages is not sequential with the other pages, the pages (or page) that are not sequential with the other pages may still be part of the large block of sequential data being accessed. In various embodiments, storage device 106 may determine, based on a read request received from a computing host, whether multiple pages or a single page should be read during a read cycle prior to performing a read.

The read cycles depict particular waveforms for the selected wordline during reads. In other embodiments, any suitable voltages may be applied to the selected wordline during each phase of the read cycle. For example, the read cycles 406 and 602 show monotonic increasing of the read levels during the sensing phase, but in other embodiments the read levels may be monotonically decreasing or may have any other suitable ordering.

Figure 7:
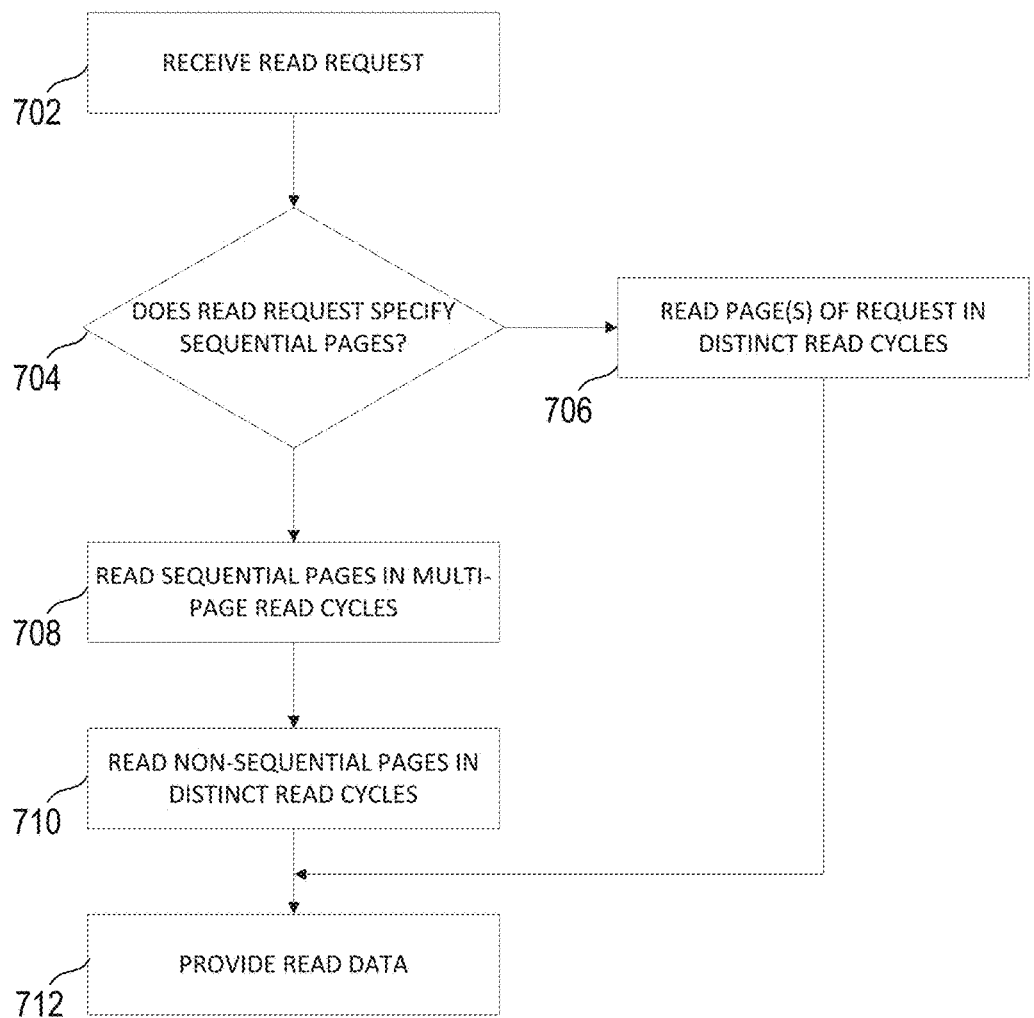
FIG. 7 illustrates an example flow for reading NAND flash memory cells in accordance with certain embodiments.

FIG. 7 illustrates an example flow 700 for reading NAND flash memory cells in accordance with certain embodiments. The flow 700 depicts example operations that may be performed by any suitable logic, such as one or more components of a storage device 106.

At 702, a read request is received from a computing host (e.g., CPU 102). The read request may specify one or more logical addresses of pages that are to be read from memory 116 of the storage device 106. At 704, storage device 106 (e.g., via storage device controller 118) may determine whether the request specifies sequential pages. In particular embodiments, the read request itself may include an identifier specifying whether the request is for sequential data or random data and such identifier may be used to determine whether the read request specifies sequential pages. In another embodiment, a particular read command may be used for sequential reads and a different read command may be used for random reads. In some embodiments, storage device controller 118 may identify one or more sets of pages (from the pages identified in the read request) that are stored together (i.e., using the same cells). Such a determination may involve accessing address translation engine 120 to determine one or more physical addresses associated with the logical addresses specified in the read request and determining based on the physical addresses which sets of pages are stored together in common cells (in various embodiments, this may mean that the pages were programmed together in the same programming pass). In some embodiments, the determination may also be based on the programming sequence used by the storage device controller 118 (e.g., how many pages are programmed in each pass and the order in which pages are programmed). In various embodiments, the storage controller 118 may store indications of which sets of pages are to be read together (i.e., in the same read cycle) and which pages should be read in distinct read cycles.

If it is determined that the read request does not specify sequential pages, one or more pages specified in the request may be read in distinct read cycles (i.e., one page is read during each read cycle) at 706. If it is determined that the read request specifies sequential pages, then for each set of sequential pages identified at 706, the pages of the set are read together in a single read cycle at 708. Any remaining pages that are not part of a sequential set (e.g., these pages are not stored together with other pages) may be read in distinct read cycles at 710. The read data is then provided to the requestor (e.g., a computing host) at 712.

The flow described in FIG. 7 is merely representative of operations that may occur in particular embodiments. In other embodiments, additional operations may be performed by the components of system 100. Various embodiments of the present disclosure contemplate any suitable signaling mechanisms for accomplishing the functions described herein. Some of the operations illustrated in FIG. 7 may be repeated, combined, modified or deleted where appropriate. Additionally, operations may be performed in any suitable order without departing from the scope of particular embodiments. For example, the data received to be written to memory may be received in multiple commands each occurring at any point in the flow.

Although various embodiments have been described with respect to particular encoding schemes (e.g., MLC, TLC, QLC), the teachings of such embodiments may be equally applicable to memories using any suitable encoding levels, including encoding schemes that become feasible in the future.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, core 114, I/O controller 110, CPU memory controller 112, storage device 106, memory device 107, memory 116, memory module 122, storage device controller 118, address translation engine 120, sense circuitry 220, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

In at least one embodiment, an apparatus comprises a storage device comprising a NAND flash memory, the storage device to receive a read request from a computing host; identify a plurality of pages specified by the read request that are stored in the same group of memory cells of the NAND flash memory, wherein each memory cell of the group of memory cells is to store a bit of each of the plurality of identified pages; and read, in a single read cycle, the plurality of pages from the group of memory cells of the NAND flash memory.

In an embodiment, the storage device is further to identify the plurality of pages stored in the same group of memory cells based on a determination that the plurality of pages were programmed together in a single programming pass. In an embodiment, the plurality of pages comprise a lower page and an upper page of data encoded in the group of memory cells using a tri-level cell (TLC) scheme. In an embodiment, the plurality of pages comprise a lower page, an upper page, and an extra page of data encoded in the group of memory cells using a TLC scheme. In an embodiment, the plurality of pages comprise a lower page, an upper page, and an extra page of data encoded in the group of memory cells using a quad-level cell (QLC) scheme. In an embodiment, the plurality of pages comprise a lower page, an upper page, an extra page, and a top page of data encoded in the group of memory cells using a QLC scheme. In an embodiment, the storage device is further to identify a page specified by the read request that is not stored in the same memory cells as any other page specified in the read request; and read the page in a second read cycle. In an embodiment, reading the plurality of pages from the group of memory cells comprises sensing the memory cells at a plurality of each of a set of read levels, the set of read levels comprising the same read levels that are sensed when multiple pages are individually read from the group of memory cells over multiple read cycles. In an embodiment, the read cycle comprises an epilogue phase, a wordline ramp phase, a sensing phase, and a read recovery phase. In an embodiment, data values stored by the plurality of pages are determined by sensing a plurality of read voltages during the sensing phase.

In at least one embodiment, a method comprises receiving a read request from a computing host; identifying a plurality of pages specified by the read request that are stored in the same group of memory cells of a NAND flash memory, wherein each memory cell of the group of memory cells is to store a bit of each of the plurality of identified pages; and reading, in a single read cycle, the plurality of pages from the group of memory cells of the NAND flash memory.

In an embodiment, the method further comprises identifying the plurality of pages stored in the same group of memory cells based on a determination that the plurality of pages were programmed together in a single programming pass. In an embodiment, the plurality of pages comprise a lower page and an upper page of data encoded in the group of memory cells using a tri-level cell (TLC) scheme. In an embodiment, the method further comprises identifying a page specified by the read request that is not stored in the same memory cells as any other page specified in the read request; and reading the page in a second read cycle. In an embodiment, reading the plurality of pages from the group of memory cells comprises sensing the memory cells at a plurality of each of a set of read levels, the set of read levels comprising the same read levels that are sensed when multiple pages are individually read from the group of memory cells over multiple read cycles. In an embodiment, the read cycle comprises an epilogue phase, a wordline ramp phase, a sensing phase, and a read recovery phase. In an embodiment, the method further comprises reading data values stored by the plurality of pages by sensing a plurality of read voltages during the sensing phase. In an embodiment, the plurality of pages comprise a lower page, an upper page, and an extra page of data encoded in the group of memory cells using a TLC scheme. In an embodiment, the plurality of pages comprise a lower page, an upper page, and an extra page of data encoded in the group of memory cells using a quad-level cell (QLC) scheme. In an embodiment, the plurality of pages comprise a lower page, an upper page, an extra page, and a top page of data encoded in the group of memory cells using a QLC scheme. In an embodiment, the plurality of pages comprise a lower page and an upper page of data encoded in the group of memory cells using a QLC scheme. In an embodiment, the method further comprises programming the plurality of pages using a single programming pass.

In at least one embodiment, a system comprises a processor to send a read request to a storage device; and a storage device comprising a NAND flash memory; and a storage device controller. The storage device controller is to receive a read request from a computing host; identify a plurality of pages specified by the read request that are stored in the same group of memory cells of the NAND flash memory, wherein each memory cell of the group of memory cells is to store a bit of each of the plurality of identified pages; and cause the plurality of pages from the group of memory cells of the NAND flash memory to be read in a single read cycle.

In an embodiment, the storage device controller is further to identify the plurality of pages stored in the same group of memory cells based on a determination that the plurality of pages were programmed together in a single programming pass. In an embodiment, the storage device controller is further to identify a page specified by the read request that is not stored in the same memory cells as any other page specified in the read request; and cause the page to be read in a second read cycle. In an embodiment, reading the plurality of pages from the group of memory cells comprises sensing the memory cells at a plurality of each of a set of read levels, the set of read levels comprising the same read levels that are sensed when multiple pages are individually read from the group of memory cells over multiple read cycles. In an embodiment, the system further comprises one or more of: a battery communicatively coupled to the processor, a display communicatively coupled to the processor, or a network interface communicatively coupled to the processor.

In at least one embodiment, a system comprises means for receiving a read request from a computing host; means for identifying a plurality of pages specified by the read request that are stored in the same group of memory cells of a NAND flash memory, wherein each memory cell of the group of memory cells is to store a bit of each of the plurality of identified pages; and means for reading, in a single read cycle, the plurality of pages from the group of memory cells of the NAND flash memory.

In an embodiment, the system further comprises means for identifying the plurality of pages stored in the same group of memory cells based on a determination that the plurality of pages were programmed together in a single programming pass. In an embodiment, the system further comprises means for identifying a page specified by the read request that is not stored in the same memory cells as any another page specified in the read request; and means for reading the page in a second read cycle. In an embodiment, reading the plurality of pages from the group of memory cells comprises sensing the memory cells at a plurality of each of a set of read levels, the set of read levels comprising the same read levels that are sensed when multiple pages are read individually from the group of memory cells over multiple read cycles. In an embodiment, the plurality of pages comprise a lower page and an upper page of data encoded in the group of memory cells using a tri-level cell (TLC) scheme.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   a storage device comprising a NAND flash memory, the storage device to:
   receive a read request from a computing host;
   identify a plurality of pages specified by the read request that are stored in the same group of memory cells of the NAND flash memory, wherein each memory cell of the group of memory cells is to store a bit of each of the plurality of identified pages; and
   read, in a single read cycle, the plurality of pages from the group of memory cells of the NAND flash memory, wherein the plurality of pages are read from the group of memory cells by applying a plurality of read levels to a wordline to read the plurality of pages, wherein the plurality of read levels are applied to the wordline during a single sensing phase after a wordline ramp phase and prior to a read recovery phase of the single read cycle.

2. The apparatus of claim 1, wherein the storage device is further to identify the plurality of pages stored in the same group of memory cells based on a determination that the plurality of pages were programmed together in a single programming pass.

3. The apparatus of claim 1, wherein the plurality of pages comprise a lower page and an upper page of data encoded in the group of memory cells using a tri-level cell (TLC) scheme.

4. The apparatus of claim 1, wherein the plurality of pages comprise a lower page, an upper page, and an extra page of data encoded in the group of memory cells using a TLC scheme.

5. The apparatus of claim 1, wherein the plurality of pages comprise a lower page, an upper page, and an extra page of data encoded in the group of memory cells using a quad-level cell (QLC) scheme.

6. The apparatus of claim 1, wherein the plurality of pages comprise a lower page, an upper page, an extra page, and a top page of data encoded in the group of memory cells using a QLC scheme.

7. The apparatus of claim 1, wherein the storage device is further to:
   identify a page specified by the read request that is not stored in the same memory cells as any other page specified in the read request; and
   read the page in a second read cycle.

8. The apparatus of claim 1, wherein the plurality of read levels applied to the wordline during the single sensing phase are the same read levels applied to the wordline over two separate read cycles to read multiple pages individually from the group of memory cells in response to a second read request and a third read request.

9. The apparatus of claim 1, wherein:
   the single read cycle comprises a single wordline ramp phase, a single sensing phase, and a single read recovery phase; and
   reading, in a single read cycle, the plurality of pages from the group of memory cells of the NAND flash memory comprises reading the plurality of pages during the single sensing phase after the single wordline ramp phase and prior to the single read recovery phase.

10. The apparatus of claim 9, wherein data values stored by the plurality of pages are determined by sensing a plurality of read voltages during the sensing phase.

11. The apparatus of claim 1, wherein the storage device is further to read the plurality of pages from the group of memory cells in the single read cycle in response to a determination that the plurality of pages are sequential.

12. A method comprising:
    receiving a read request from a computing host;
    identifying a plurality of pages specified by the read request that are stored in the same group of memory cells of a NAND flash memory, wherein each memory cell of the group of memory cells is to store a bit of each of the plurality of identified pages; and
    reading, in a single read cycle, the plurality of pages from the group of memory cells of the NAND flash memory, wherein the plurality of pages are read from the group of memory cells by applying a plurality of read levels to a wordline to read the plurality of pages, wherein the plurality of read levels are applied to the wordline during a single sensing phase after a wordline ramp phase and prior to a read recovery phase of the single read cycle.

13. The method of claim 12, further comprising identifying the plurality of pages stored in the same group of memory cells based on a determination that the plurality of pages were programmed together in a single programming pass.

14. The method of claim 12, further comprising:
    identifying a page specified by the read request that is not stored in the same memory cells as any another page specified in the read request; and
    reading the page in a second read cycle.

15. The method of claim 12, wherein reading the plurality of pages from the group of memory cells comprises sensing the memory cells at a plurality of each of a set of read levels, the set of read levels comprising the same read levels that are sensed when multiple pages are read individually from the group of memory cells over multiple read cycles.

16. The method of claim 12, wherein the plurality of pages comprise a lower page and an upper page of data encoded in the group of memory cells using a multi-level cell (MLC) scheme.

17. A system comprising:
    a processor to send a read request to a storage device; and
    a storage device comprising:

a NAND flash memory; and a storage device controller to:

receive a read request from a computing host;

identify a plurality of pages specified by the read request that are stored in the same group of memory cells of the NAND flash memory, wherein each memory cell of the group of memory cells is to store a bit of each of the plurality of identified pages; and cause the plurality of pages from the group of memory cells of the NAND flash memory to be read in a single read cycle, wherein the plurality of pages are read from the group of memory cells by applying a plurality of read levels to a wordline to read the plurality of pages, wherein the plurality of read levels are applied to the wordline during a single sensing phase after a wordline ramp phase and prior to a read recovery phase of the single read cycle.

18. The system of claim 17, wherein the storage device controller is further to identify the plurality of pages stored in the same group of memory cells based on a determination that the plurality of pages were programmed together in a single programming pass.

19. The system of claim 17, wherein the storage device controller is further to:

identify a page specified by the read request that is not stored in the same memory cells as any other page specified in the read request; and cause the page to be read in a second read cycle.

20. The system of claim 17, wherein reading the plurality of pages from the group of memory cells comprises sensing the memory cells at a plurality of each of a set of read levels, the set of read levels comprising the same read levels that are sensed when multiple pages are individually read from the group of memory cells over multiple read cycles.

21. The system of claim 17, further comprising one or more of: a battery communicatively coupled to the processor, a display communicatively coupled to the processor, or a network interface communicatively coupled to the processor.

* * * * *